US011744020B2

(12) United States Patent
Norell et al.

(10) Patent No.: US 11,744,020 B2
(45) Date of Patent: Aug. 29, 2023

(54) MECHANICALLY BRIDGED SMD INTERCONNECTS FOR ELECTRONIC DEVICES

(71) Applicant: Texas Instruments Incorporated, Dallas, TX (US)

(72) Inventors: Kyle Brent Norell, Plano, TX (US); Claude Albert Fernandez, Palatine, IL (US); Charles Allen DeVries, Winfield, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 72 days.

(21) Appl. No.: 17/537,721

(22) Filed: Nov. 30, 2021

(65) Prior Publication Data

US 2023/0171894 A1   Jun. 1, 2023

(51) Int. Cl.
*H05K 3/22* (2006.01)
*H05K 1/18* (2006.01)
*H05K 1/11* (2006.01)
*H05K 3/28* (2006.01)
*H05K 3/34* (2006.01)

(52) U.S. Cl.
CPC ............ *H05K 1/181* (2013.01); *H05K 1/111* (2013.01); *H05K 3/222* (2013.01); *H05K 3/284* (2013.01); *H05K 3/288* (2013.01); *H05K 3/3421* (2013.01); *H05K 2201/1003* (2013.01); *H05K 2201/10015* (2013.01); *H05K 2201/1031* (2013.01); *H05K 2201/10174* (2013.01); *H05K 2201/10628* (2013.01); *H05K 2203/1316* (2013.01)

(58) Field of Classification Search
CPC .................. H05K 3/222; H05K 3/284; H05K 2201/1031; H05K 2203/1316
See application file for complete search history.

(56) References Cited

U.S. PATENT DOCUMENTS

| | | | | |
|---|---|---|---|---|
| 4,855,807 A | * | 8/1989 | Yamaji | H01L 23/3107 257/667 |
| 5,012,386 A | * | 4/1991 | McShane | H01L 24/49 257/E23.068 |
| 9,257,393 B1 | * | 2/2016 | Gong | H01L 23/552 |
| 2008/0013298 A1 | * | 1/2008 | Sharma | G01R 33/09 361/813 |
| 2012/0088409 A1 | | 4/2012 | Freedman | |
| 2016/0056097 A1 | * | 2/2016 | Bai | H01L 24/97 257/676 |
| 2020/0357987 A1 | * | 11/2020 | Li | H10N 52/101 |

* cited by examiner

Primary Examiner — Sherman Ng
(74) Attorney, Agent, or Firm — Ronald O. Neerings; Frank D. Cimino (57) ABSTRACT

An electronic device includes a package substrate, at least one integrated circuit (IC) die including a substrate having a semiconductor surface including circuitry electrically coupled to bond pads positioned onto contact pads on a top surface of a package substrate. At least one surface mount device (SMD) component including at least a first terminal and a second terminal is on the package substrate positioned lateral to the IC die. There is at least one SMD interconnect electrically connecting to at least one of the first terminal and the second terminal to the bond pads. The SMD interconnect includes a portion of a tie bar that extends to an outer edge of the electronic device.

19 Claims, 8 Drawing Sheets

MECHANICALLY BRIDGED SMD INTERCONNECTS FOR ELECTRONIC DEVICES

FIELD

This Disclosure relates to surface mount device (SMD) interconnects for SMD components utilized for molded electronic devices that comprise a package substrate and at least one integrated circuit (IC).

BACKGROUND

Some molded electronic devices, such as power module devices, include SMD components that include an interconnection to a host device that typically comprises a package substrate, for example, a molded interconnect substrate (MIS), printed circuit board (PCB), or a leadframe, and at least one IC die. The IC die is embedded within the MIS or mounted thereon on a top surface of the package substrate. The package substrate can also comprise a laminate-based PCB configured as a mold encapsulated system in package" ("SiP"). The electronic device may comprise a plurality of different electronic components some being SMD components, including but not limited to a power IC, along with SMD components comprising capacitors, resistors, and inductors, which each may be mounted internal to and/or external relative to the mold compound. The SMD component can also comprise a transformer which is a four (or more) terminal device.

A conventional SMD component has its own interconnects, such as in the case of an SMD capacitor the capacitor has a first SMD interconnect electrically connected to the top plate and a second SMD interconnect electrically connected to the bottom plate. In the case of a PCB or MIS, the PCB or MIS normally includes metal traces with solder on the end for electrically contacting the SMD interconnects. The PCB or MIS is for connecting the SMD interconnect and IC components together electrically and mechanically generally using solder connections.

Conventional SMD interconnects are limited in their geometric design due to center of gravity considerations needed to be able to achieve placement stability during conventional assembly manufacturing processing, and resilience to machine vibration/mechanical disturbances during assembly. As such, the geometry for conventional SMD interconnections must typically be substantially symmetrical, and also the surface area on the package substrate of the host device generally must be sacrificed to create an electrically and mechanically sufficient interconnection between the host device and the SMD component.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional SMD interconnects for connecting SMD components to the IC(s) of host devices that comprise package substrates having at least one IC die thereon (or therein in the case of embedded IC die) that are conventionally processed in tape and reel (TnR) form, are singular, meaning that the SMD interconnects are placed individually. Singular may be contrasted with mechanically bridged (joined) pluralities of SMD interconnects that are disclosed herein. "Gang attach" using a gang clip is a commonly used assembly method to mount a large plurality of SMD interconnects simultaneously (instead of singularly mounting a clip) typically implemented for assembling power device packages. However, gang clips are known to require complex and expensive dedicated assembly equipment to be utilized.

Disclosed pluralities of mechanically bridged SMD interconnects allows for simultaneous mounting of what will be a plurality of SMD interconnects after singulation on a package substrate strip (or panel or sheet) having a plurality of units with each unit including a host device. The number of plurality of SMD interconnects for disclosed mechanically bridged SMD interconnects is at least two, and generally up to four for transformers utilizing standard TnR/surface mount (SMT) equipment, such that custom and often complex "gang attach" processes when utilizing gang clips are not required.

Disclosed mechanically bridged plurality of SMD interconnects are generally placed so that their center (the tie bar region) is on the saw street region center-line between in-process electronic device units on an electronic device strip comprising a package substrate comprising a leadframe, PCB or an MIS. Following singulation of the respective electronic devices from the strip, each mechanically bridged plurality of SMD interconnects becomes an individual (separated) SMD interconnect that are electrically and mechanically isolated from the other SMD interconnects that they were previously mechanically joined to.

Some of the plurality of mechanically bridged SMD interconnects can also optionally be placed on the package substrate fully inside the saw street region to thus remain mechanically and electrically joined within the electronic device, such as for a multi-phase transformer arrangement that may be included in a power module implementation. Electrical isolation of the respective SMD interconnects of the mechanically bridged plurality of SMD interconnects when having their center on the saw street center line is accomplished by sawing the saw streets which cuts the tie bars that connect together the plurality of mechanically bridged SMD interconnects.

Disclosed aspects include an electronic device including a package substrate, at least one IC die including a substrate having a semiconductor surface including circuitry electrically coupled to bond pads positioned onto contact pads on a top surface of a package substrate. At least one SMD component including at least a first terminal and a second terminal is on the package substrate positioned lateral to the IC die. There is at least one SMD interconnect electrically connecting to at least one of the first terminal and the second terminal to the bond pads. The SMD interconnect includes a portion of a tie bar that extends to an outer edge of the electronic device, such as having a tie bar end portion exposed from a mold compound for a molded electronic device.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Figure 1A:
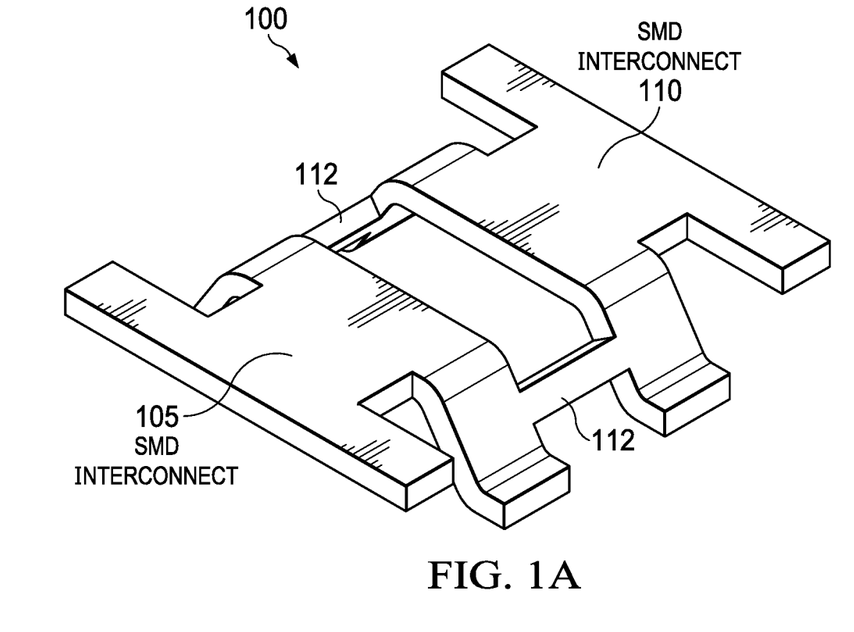
FIG. 1A depicts an example mechanically bridged SMD interconnect showing a first SMD interconnect and a second SMD interconnect that are mechanically connected together by first and second tie bars.

FIG. 1A depicts an example mechanically bridged SMD interconnect 100 showing a first SMD interconnect 105 and a second SMD interconnect 110 that are mechanically connected together by a first and second tie bar each shown as 112. Although shown in FIG. 1A having the same geometry, the first SMD interconnect 105 and second SMD interconnect 110 can have different geometries.

Figure 1B:
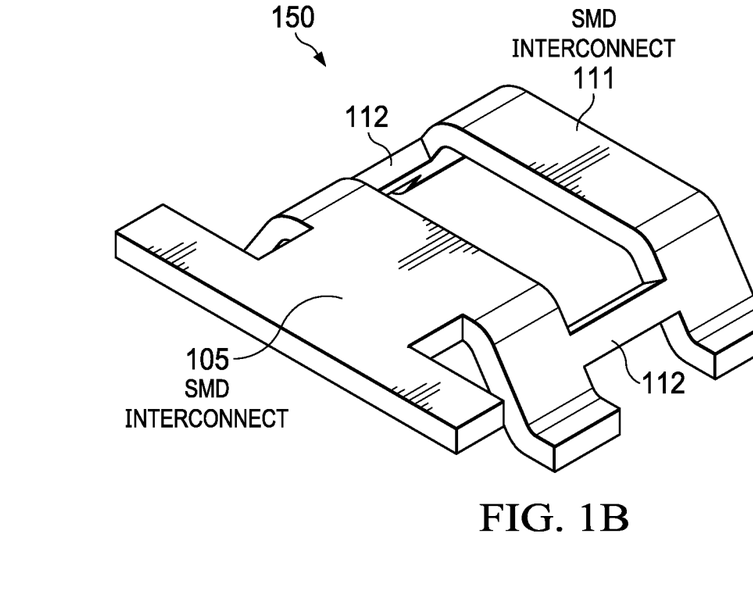
FIG. 1B depicts an example mechanically bridged SMD interconnect showing a first SMD interconnect and a second SMD interconnect having a different geometry as compared to the first SMD interconnect, that are again shown mechanically connected together by first and second tie bars.

FIG. 1B depicts for example, mechanically bridged SMD interconnect 150 showing a first SMD interconnect 105 and a second SMD interconnect 111 having a different geometry as compared to the first SMD interconnect 105, that are again shown mechanically connected together by first and second tie bars 112. An advantage of pairing the SMD interconnects is that the cantilever portions which corresponds to the raised ends of the SMD interconnects, can be extended (i.e., where the SMD interconnect meets the SMD component), allowing for more robust solderable (or electrically conductive epoxy or other suitable conductive material) connection to the SMD component's termination. The SMD component can comprise an inductor, resistor, capacitor, transformer, or a diode.

The mechanically bridged SMD interconnect 150 generally comprises copper. Although the mechanically bridged SMD interconnect 150 is shown having two SMD interconnects (first SMD interconnect 105, and second SMD interconnect 111), there can be mechanically joined three or more SMD interconnects including multiples of 2 such as 4, or even odd number of joined interconnects depending on the particular device layout.

Figure 2A:
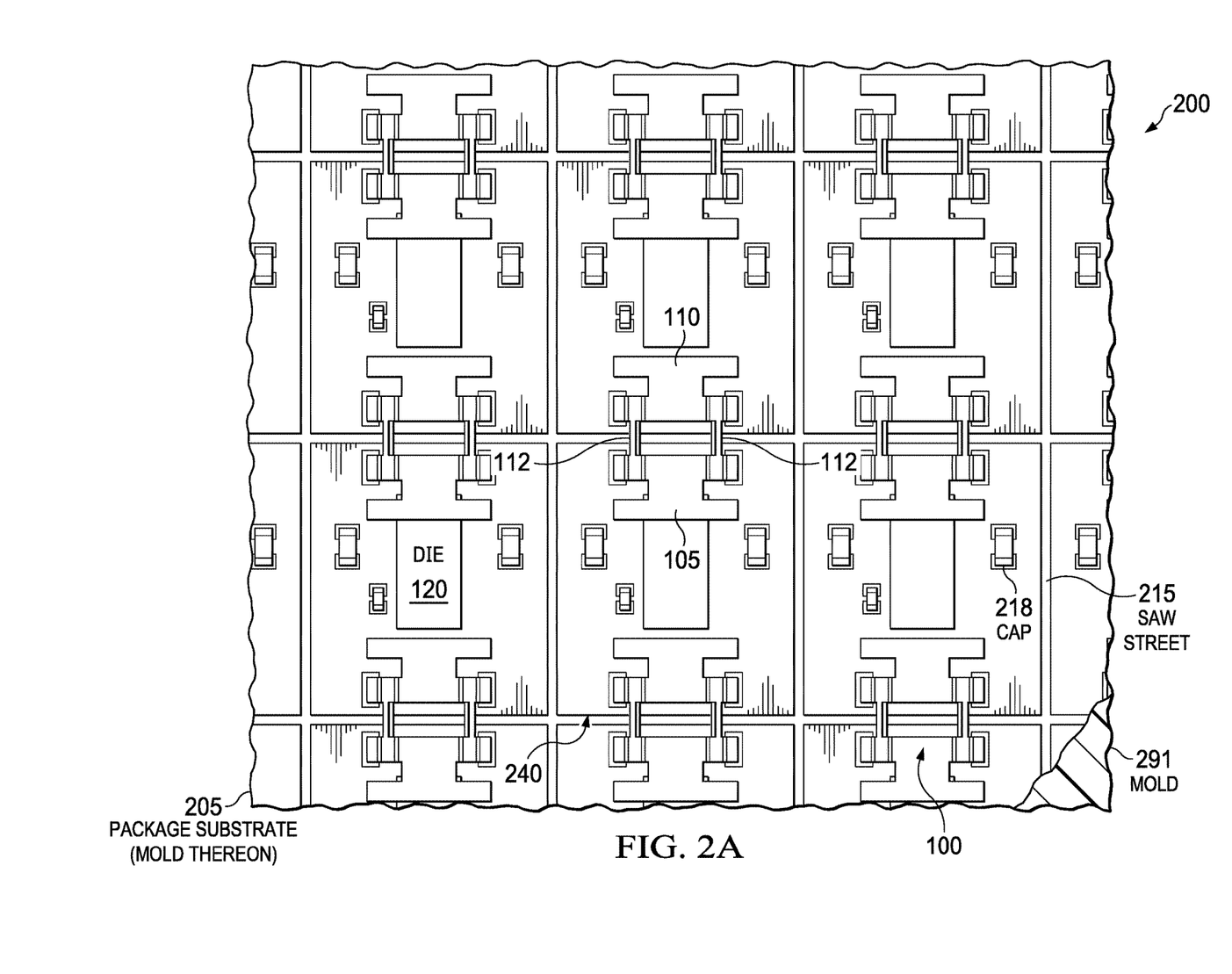
FIG. 2A depicts a portion of an example strip of molded in-process electronic devices each including the mechanically bridged SMD interconnects shown in FIG. 1A positioned between adjacent electronic device units.

FIG. 2A depicts a portion of an example strip 200 of molded in-process electronic devices 240 each including the mechanically bridged SMD interconnects 100 shown in FIG. 1A positioned between adjacent electronic device units 240. The mold compound is shown as 291. Each electronic device 240 includes a semiconductor die 120 which can be mounted flipchip, and in one arrangement can comprise a silicon-based power converter IC.

Each mechanically bridged SMD interconnect 100 with only one identified in FIG. 2A includes a first SMD interconnect 105 and a second SMD interconnect 110 that are mechanically connected together by tie bars 112 that are positioned (placed) so that the tie bars 112 are over the saw streets 215 shown including on the saw street's 215 centerline between molded in-process electronic device units 240 on the electronic device strip 200. As noted above, the package substrate 205 can comprise a PCB, leadframe, or an MIS.

Following molding in the typical case of a molded electronic device, the SMD interconnect is overmolded, and its top surface is then typically exposed (such as by using grinding, film assist molding, or laser ablation) to create a solderable contact area(s) for connecting the SMD component. There is generally then a solder deposition step or deposition of another electrically conductive material such as metal filled epoxy, or sintered silver deposition in the contact area of the SMD interconnect.

To create an electro-mechanical connection the SMD component is placed to make contact to the contact areas of the SMD interconnect and the electro-mechanical connection is established between the SMD interconnect and the SMD component. The SMD interconnect is electrically and mechanically connected to metal traces on the package substrate which as described above is generally molded, and finally the exposed device pads of the package substrate (generally on a bottom side) are generally connected to a host substrate, for example to a PCB.

Singulation of the respective electronic devices from the electronic device strip 200 results in the plurality of mechanically bridged SMD interconnects 100 becoming electrically and mechanically isolated SMD interconnects 105 and 110. Each electronic device unit 240 is shown by example including three surface mount capacitors, and each capacitor termination (plate) is electrically and mechanically connected to the electronic device, with all the capacitors shown as 218. Although not shown, there are metal traces on a surface of the package substrate 205 generally having solder on the ends for making an electrical contact between the SMD interconnects 105 or 110 and the capacitors 218, generally using a solder connection or another suitable electrically conductive material such as a metal filled conductive epoxy, or sintered silver.

Figure 2B:
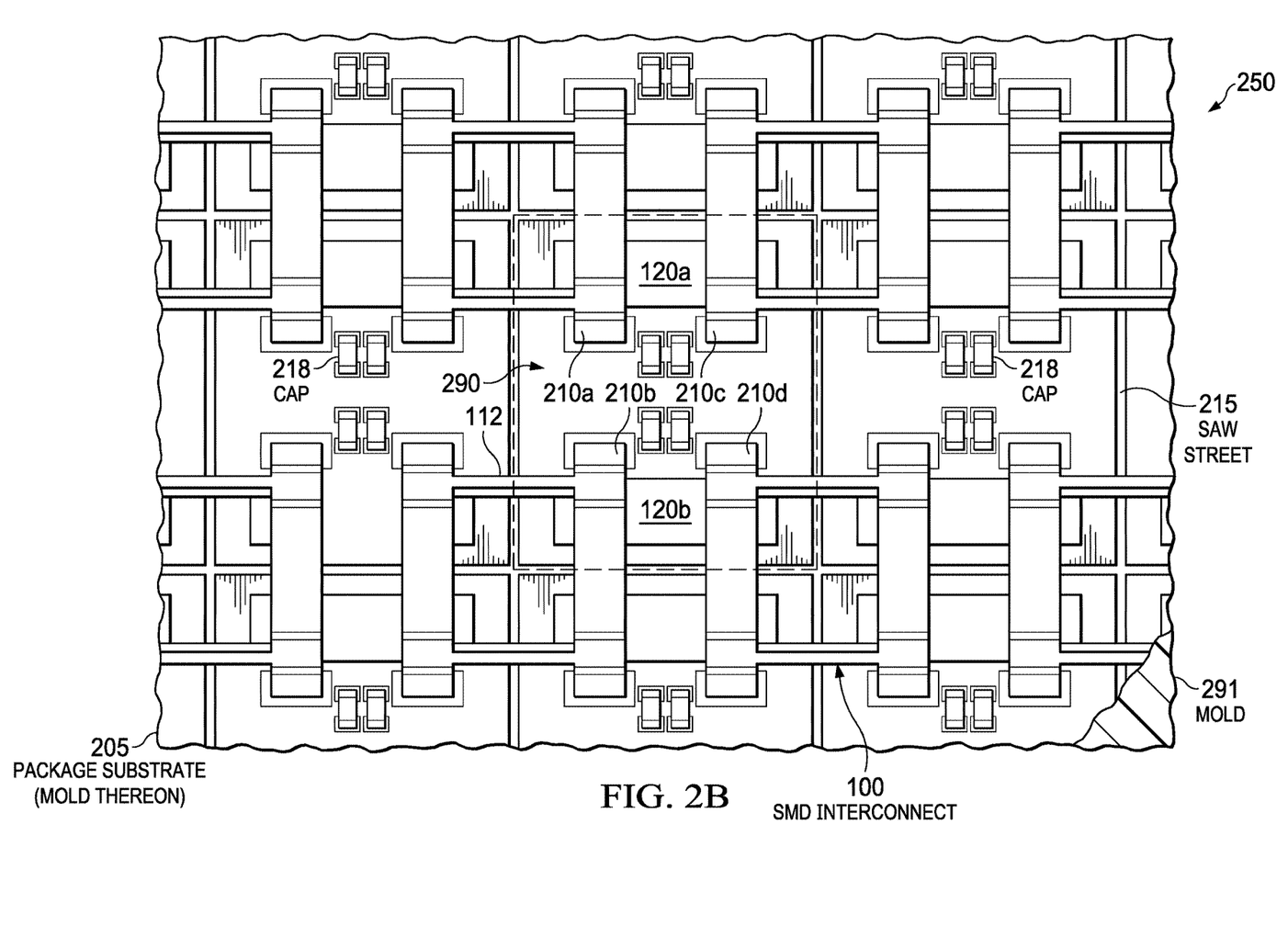
FIG. 2B depicts a portion of an example strip of molded in-process electronic devices each including mechanically bridged SMD interconnects similar to those shown in FIG. 1A, but here with the mechanically bridged SMD interconnects containing four interconnects rather than two, being positioned over four adjacent molded electronic devices. The molded electronic devices can implement an isolated DC-DC SIP power module with a transformer. Each molded electronic device includes a first and a second semiconductor die that are shown flipchip mounted onto the package substrate. The SMD component for which this configuration is intended is a four terminal transformer.

FIG. 2B depicts a portion of an example strip 250 of molded in-process electronic devices 290 each including the mechanically bridged SMD interconnects 100 shown in FIG. 1A with one mechanically bridged SMD interconnect 100 identified in this FIG., with each mechanically bridged SMD interconnect 100 being positioned over four adjacent molded electronic devices 290. The molded electronic devices 290 can implement an isolated DC-DC SIP power module including a transformer. Each molded electronic device 290 includes a first semiconductor die 120a and a second semiconductor die 120b that are shown flipchip mounted onto the package substrate 205. The SMD component here is a transformer. Because the SMD component is a transformer there are 4 independent SMD interconnects that will be provided after singulation for each of the electronic devices 290, shown as 210a, 210b, 210c, and 210d, instead of only 2, such as for the mounting of a inductor.

Figure 3:
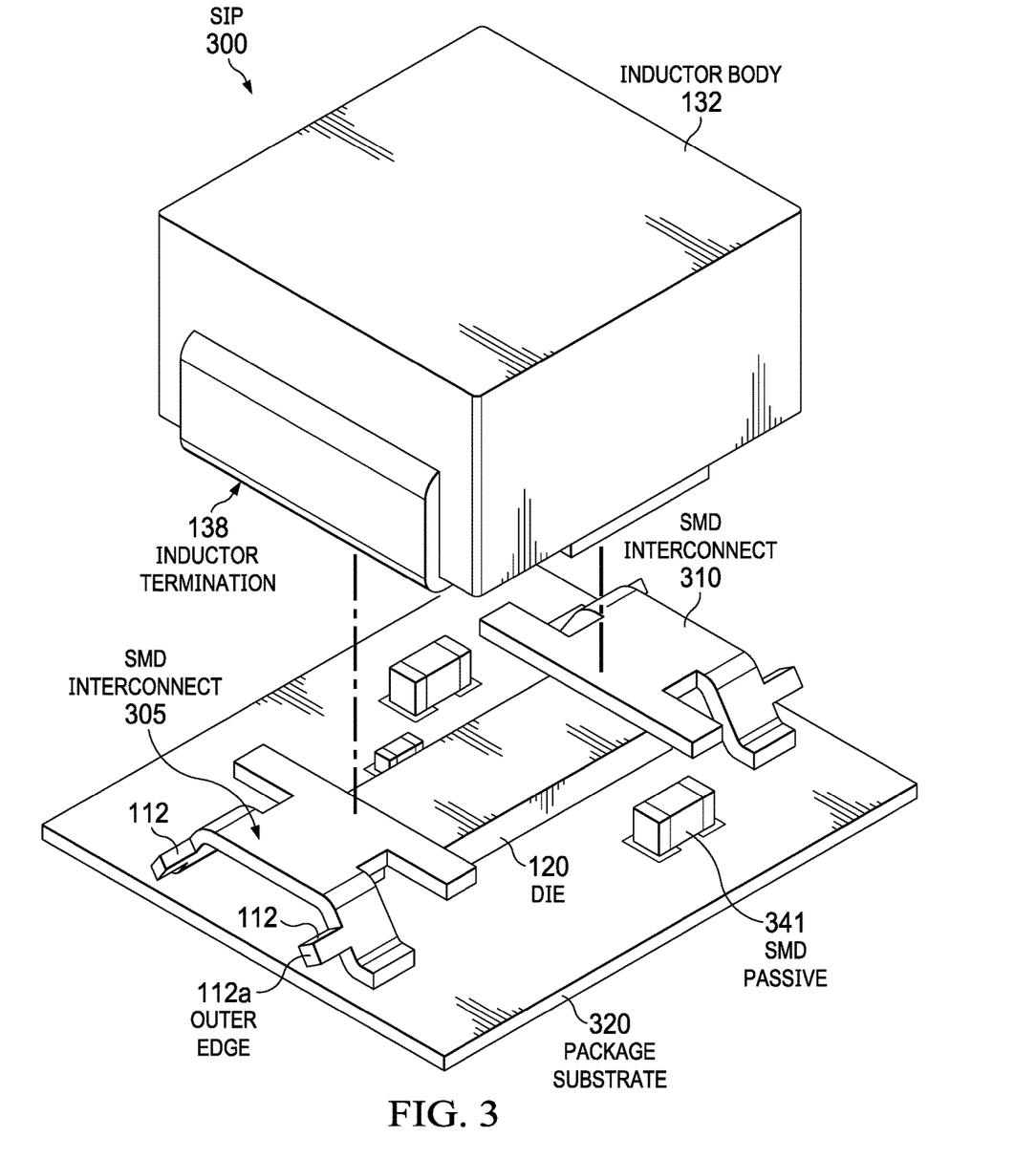
FIG. 3 shows an example in-process SIP in a power module implementation after singulation including an SMD component shown as being an inductor comprising an inductor body and an inductor terminations.

FIG. 3 shows an example in-process SIP 300 in a power module implementation after singulation including an SMD component shown as being an inductor comprising an inductor body 132, and an inductor terminations 138. The internal winding of the inductor is generally pre-molded within the inductor body 132 is typically applied by an inductor supplier, and received as shown with exposed inductor terminations 138 on both sides, for the final connection to the SMD interconnects 305 and 310.

A power conversion device is only one particular implementation of this interconnect configuration. For viewing purposes only, the inductor 132/138 is shown raised above the SMD interconnects 305 and 310 having an outer edge surface shown as 112a (outer edge of its tie bar) that extends to an edge of the package substrate 320 that as described above can comprise a MIS, PCB or a leadframe that it is mounted on. The outer edge surfaces of the SMD interconnects 305 and 310 will be consequently co-planar with the outer edge of the package substrate 320 or be coplanar with a mold material when generally present on the package substrate 320 of the singulated molded electronic device package, where the tie-bar of the SMD interconnects will be severed following the singulation of the strip.

The package substrate 320 is shown including a semiconductor die 120 thereon and an SMD passive component 341. However, the electronic device does not necessarily need to include a semiconductor die to utilize the disclosed mechanically bridged SMD interconnects. The SMD interconnects 305 and 310 can generally be applied to any situation where electro-mechanical connection is needed. For illustration purposes, although there is a mold compound providing encapsulation for the SIP 300 except for the inductor 132/138, there is no mold compound shown in FIG. 3 to reveal the respective components of the SIP 300.

Figure 4A:
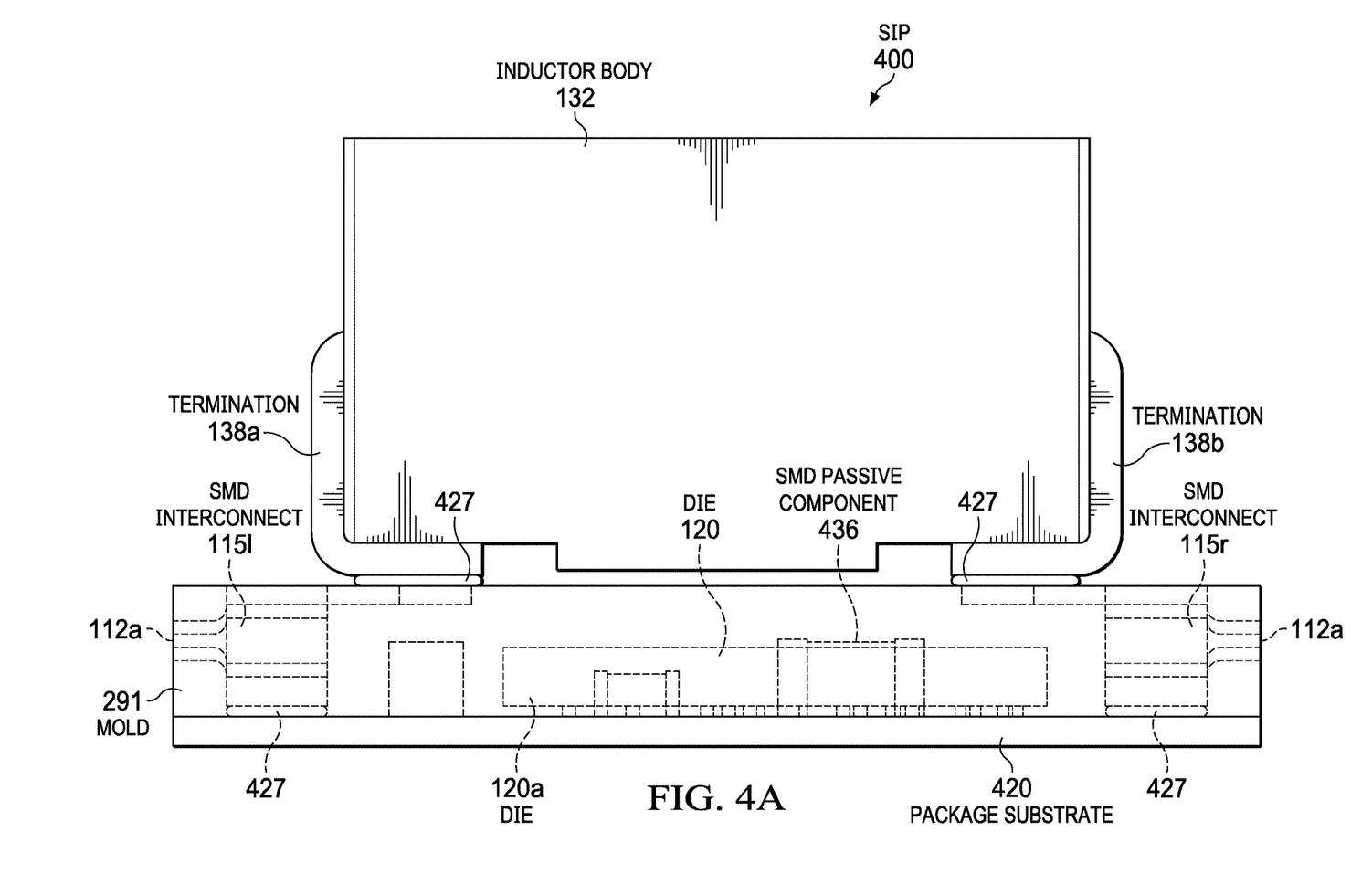
FIG. 4A shows an example in-process SIP in a power module implementation including an SMD component shown again as being an inductor that has a first exposed termination shown connected to it on one side of the inductor body, and a second exposed termination connected to it on an opposite side of the inductor body.

FIG. 4A shows an example in-process SIP 400 in a power module implementation including an SMD component shown again as being an inductor comprising an inductor body 132, and an inductor terminations 138 that has a first exposed termination 138a shown connected to it on one side of the inductor body 132 and a second exposed termination 138b connected to it on an opposite side of the inductor body 132. The respective exposed terminations 138a, 138b are assembled on SMD interconnects (that can be referred to as being "clips") shown as 115l and 115r having an outer edge surface 112a (provided by its tie bar) that extends to an outer edge of the package substrate 420 that the SMD interconnects are mounted on.

On a surface of the package substrate 420 is a semiconductor die 120 shown flipchip mounted and a SMD passive component 436. Alternatively, the semiconductor die 120 can be wire bonded. There are also a plurality of electrically conductive material regions acting as interfaces, such as comprising solder or an electrically conductive epoxy, two for each for the mounting of the exposed terminations 138a, 138b, and one each for the mounting of the respective SMD interconnects 115l, 115r, with all the electrically conductive material shown as 427.

Figure 4B:
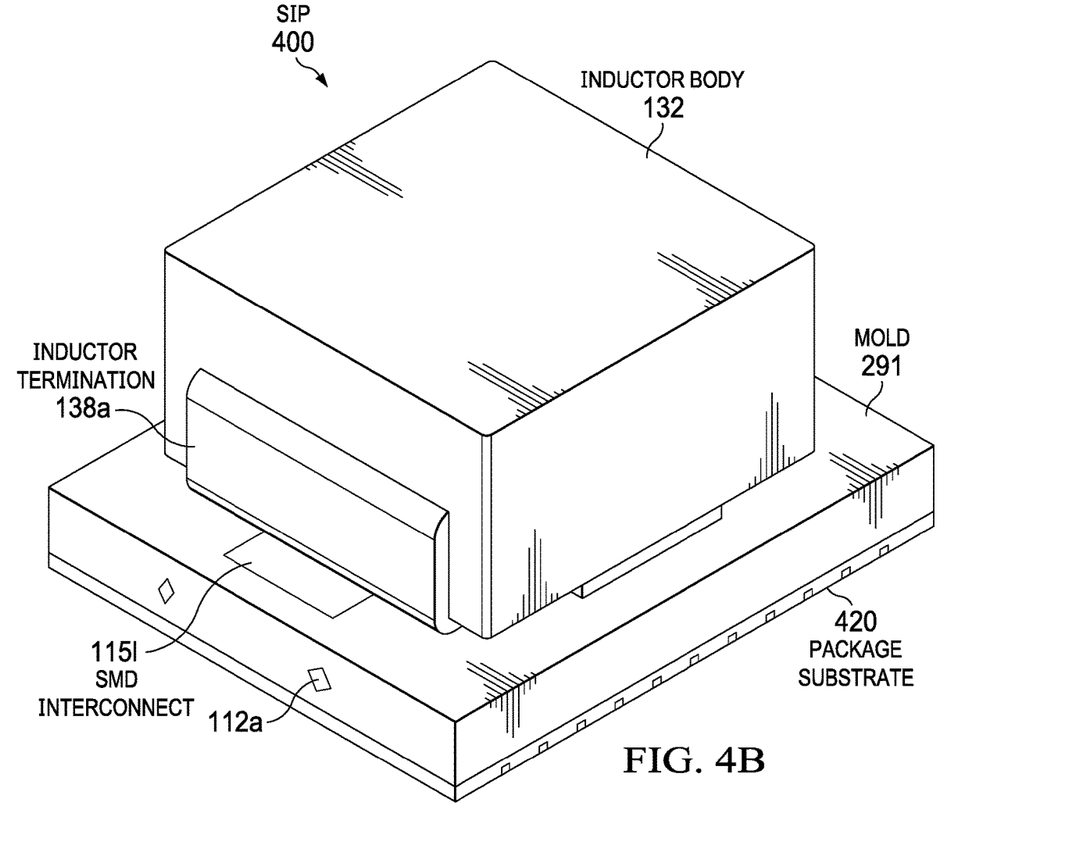
FIG. 4B shows a top perspective view of an example SIP reflecting a finished electronic device after singulation. The SIP comprises the direct stack-up of the electronic device unit shown in FIG. 2A including the package substrate including a semiconductor die (not visible in FIG. 4B) shown mounted thereon, a disclosed SMD interconnect, and the SMD component shown again as being an inductor, with one of the inductor terminations shown.

FIG. 4B shows a top perspective view of an example SIP 400 reflecting a finished electronic device after singulation. The SIP 400 comprises the direct stack-up of the electronic device unit 240 shown in FIG. 2A including the package substrate 205 now shown as 420 including a semiconductor die (not visible in FIG. 4B) shown mounted thereon, a disclosed SMD interconnect 115l, and the SMD component shown again as an inductor comprising an inductor body 132, with one of the inductor terminations being shown as 138a.

Figure 5:
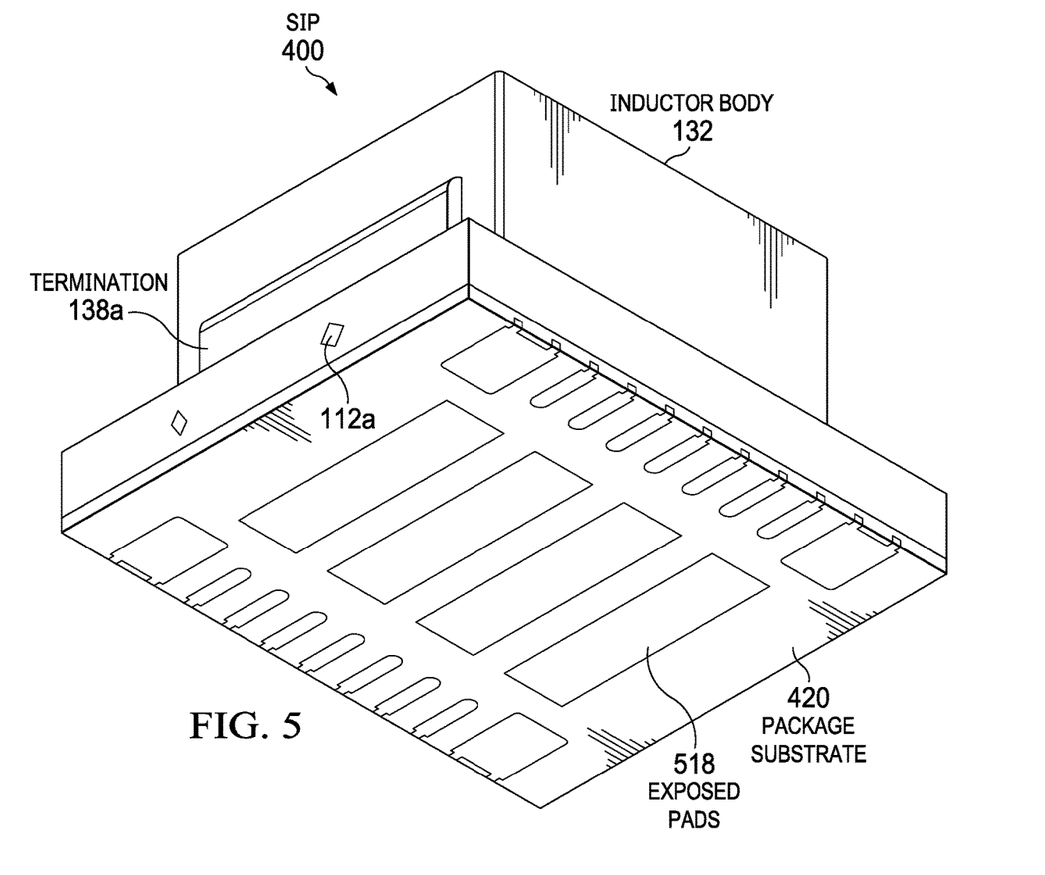
FIG. 5 shows a bottom perspective view of the example SIP shown in FIG. 4B. On a bottom side of the package substrate, there is shown exposed contact pads configured for mounting to a host device, such as a PCB. The outer edge surface of the tie bar of an SMD interconnect is also shown exposed from the outer edge of the mold compound on the package substrate.

FIG. 5 shows a bottom perspective view of the example SIP 400 shown in FIG. 4B. On a bottom side of the package substrate 420 there is shown exposed contact pads shown as 518, configured for mounting to a host device, such as a PCB. The outer edge surface 112a of the tie bar of an SMD interconnect is also shown exposed from the edge of the mold compound 291 shown in FIG. 4B on the surface of the package substrate 420.

Figure 6:
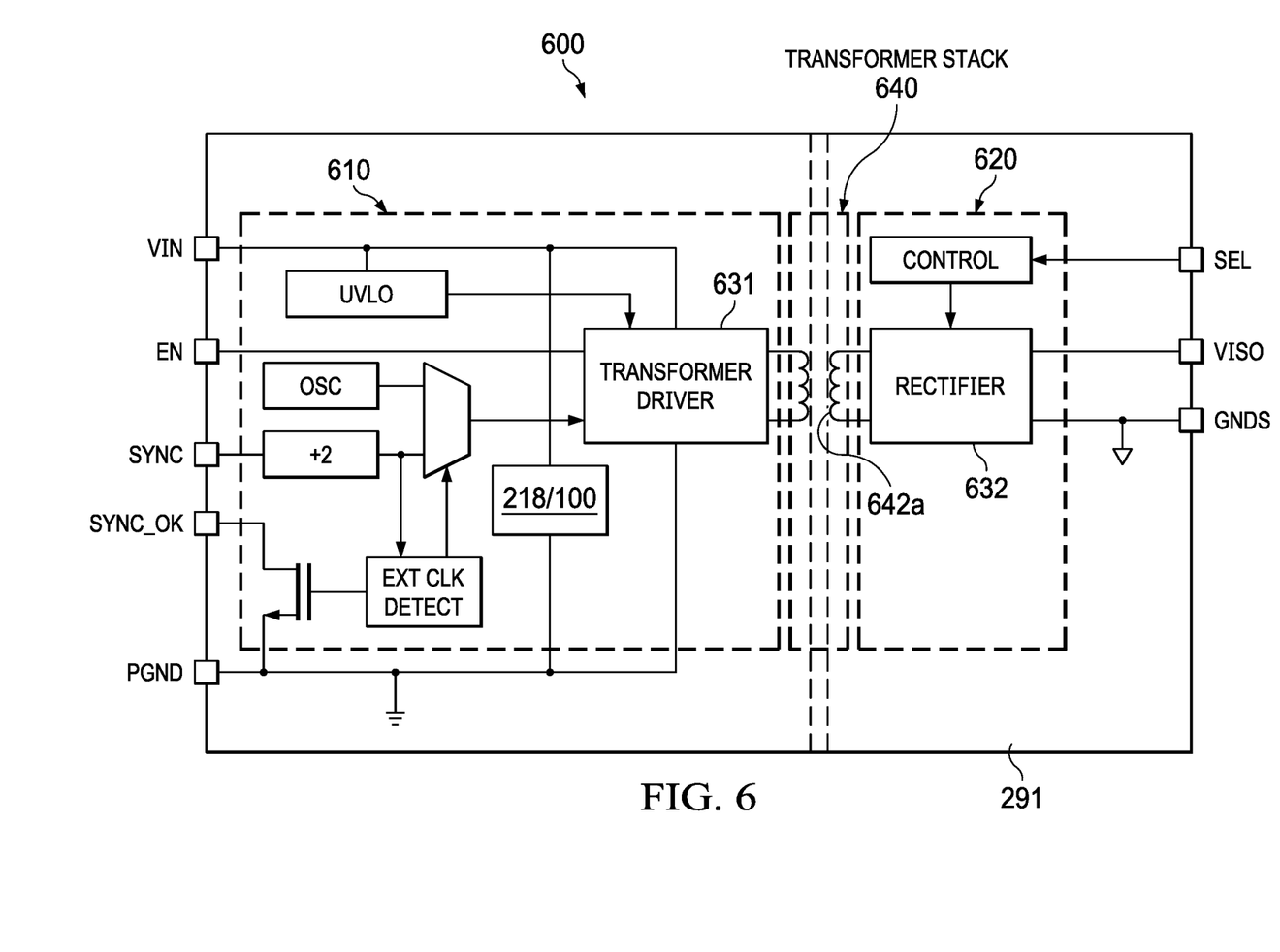
FIG. 6 shows a functional block diagram for an example isolated DC-DC converter package comprising a package substrate shown as a leadframe, showing a typical example of a capacitor placement along with a disclosed SMD interconnect shown collectively as 218/100 connected between VIN and PGND which comprises an input bypass capacitor arrangement. The isolated DC-DC converter package comprises a primary side including a first semiconductor die that includes a transformer driver and a secondary side including a second semiconductor die including a rectifier. There is a transformer stack including at least one coil is positioned between the first semiconductor die and the second semiconductor die.

FIG. 6 shows a functional block diagram for an example isolated DC-DC converter package 600 comprising a package substrate shown as a leadframe, showing a typical example of a capacitor 218 placement along with a disclosed SMD interconnect 100 shown together as 218/100 connected between VIN and PGND (power ground) which is an input bypass capacitor arrangement. The mold compound is shown as 291, and only the eight pins are shown for representing the leadframe. The isolated DC-DC converter package 600 comprises a primary side including a first semiconductor die 610 that includes a transformer driver 631 and a secondary side including a second semiconductor die 620 including a rectifier 632. There is a transformer stack 640 including at least one coil 642a positioned between the first semiconductor die 610 and the second semiconductor die 620 for providing the isolation between the first semiconductor die 610 and the second semiconductor die 620.

Disclosed mechanically bridged SMD interconnects allow for greater design flexibility as compared to conventional SMD interconnects in terms of interconnect geometry (longer cantilevers, greater elevated surface areas, etc.), and also reduce the center of gravity design concerns since the mechanical footprint is more stable during assembly before molding and singulation of the sheet. This contributes to improved resilience of the SMD interconnects to mechanical excitations (machine vibration, etc.) during assembly. Additional advantages include, but are not limited to, piece part and assembly cost reduction/throughput increase (compared to that of conventional SMD interconnects), "off the shelf" component selection capability (inductors for a power module implementation), and more rapid product development/reduced time to market due to design flexibility and re-use provided.

Disclosed mechanically joined SMD interconnects provide the ability to achieve greater mechanical design flexibility/diverse geometry of formed SMD interconnects, resulting in more mechanically efficient electronic devices. Disclosed mechanically joined SMD interconnects can be utilized using conventional surface mount (SMT) assembly processes such as tape and reel (TnR) and pick and place (PnP). This makes it possible to avoid relatively complex "gang attach" processes. The disclosed interconnection method also includes applications in multiple device packaging constructions, including "open frame" applications which refers to an electronic device that is not encapsulated with a molding compound, where all integrated components (power IC+SMD component such as capacitors and resistors, and SMD interconnect, etc.) are exposed to the atmosphere.

Disclosed SMD interconnects on individual molded electronic devices are detectable due to the saw operation sharing of the SMD interconnect plurality across two or more adjacent electronic devices. There will always be at least one externally visible (outside of the mold compound) tie bar that joins one SMD interconnect portion to the other SMD interconnect portion, not inclusive of host-substrate and/or leadframe tie bars, which is an artifact of the SMD interconnect plurality being joined prior to singulation. This is an inherent feature of disclosed aspects, which can be a fingerprint for detection for the individual molded electronic device, depending upon the particular implementation.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An electronic device, comprising:
a package substrate;
at least one integrated circuit (IC) die comprising a substrate having a semiconductor surface including circuitry electrically coupled to bond pads positioned onto contact pads on a top surface of a package substrate,
at least one surface mount device (SMD) component including at least a first terminal and a second terminal on the package substrate positioned lateral to the IC die, and
at least one SMD interconnect including a tie bar electrically connecting to at least one of the first terminal and the second terminal to the bond pads,
wherein the tie bar extends to an outer edge of the electronic device,
a mold compound for encapsulating at least the IC die, wherein the tie bar extends to be exposed from the outer edge of the mold compound.

2. The electronic device of claim 1, wherein the package substrate comprises leadframe, a printed circuit (PCB) or a molded interconnect substrate (MIS).

3. The electronic device of claim 1, wherein the at least one SMD interconnect electrically connects to at least one of the first terminal and the second terminal to the bond pads further comprising connects to the first terminal and the second terminal to the bond pads.

4. The electronic device of claim 1, wherein at least one SMD interconnect includes a first interconnect having a first geometry and a second SMD interconnect having a second geometry that is different from the first geometry.

5. The electronic device of claim 1, wherein the SMD compartment comprises an inductor, resistor, capacitor, transformer, or a diode.

6. The electronic device of claim 5, wherein the SMD component comprises the inductor, and wherein the IC die comprises a power IC die.

7. The electronic device of claim 1, further comprising an electrically conductive material between the SMD interconnect and the first terminal and the second terminal.

8. The electronic device of claim 1, wherein the electronic device comprises a system in package (SIP).

9. A method, comprising:
providing a strip of package substrates including a mechanically interconnected plurality of surface mount device (SMD) interconnects joined by a tie bar that extends across through a saw street region between respective neighboring ones of the package substrates that mechanically connects to neighboring ones of the package substrates;
mounting at least one integrated circuit (IC) die on each of the package substrates, the IC die comprising a substrate having a top side semiconductor surface including circuitry electrically coupled to bond pads that are electrically coupled to the SMD interconnects;
molding to form a mold compound for encapsulating at least the IC die and the SMD interconnects;
removing the mold compound in a first contact portion and a second contact portion of the first and the second SMD interconnect, respectively;
mounting an SMD component having a first terminal and at least a second terminal with the first terminal mounted on the first contact portion and the second terminal mounted on the second contact portion, and
singulating the sheet of package substrates including cutting the SMD interconnects in the saw street region to provide a plurality of molded electronic devices, wherein a portion of the tie bar of the SMD interconnects extend to be exposed from an outer edge of the mold compound.

10. The method of claim 9, wherein the package substrate comprises a leadframe, molded interconnect substrate (MIS), or a printed circuit board (PCB).

11. The method of claim 9, wherein the at least one SMD interconnect electrically connects to at least one of the first terminal and the second terminal to the bond pads, further comprising connections to at least one of the first terminal and the second terminal to the bond pads.

12. The method of claim 9, wherein the at least one SMD interconnect electrically connects to both of the first terminal and the second terminal to the bond pads further comprising connections to the first terminal and the second terminal to the bond pads.

13. The method of claim 9, wherein the SMD component comprises an inductor, resistor, capacitor, transformer, or a diode.

14. The method of claim 13, wherein the SMD component comprises the inductor, and wherein the IC die comprises a power IC die.

15. The method of claim 9, further comprising an electrically conductive material between the SMD interconnect and the first terminal and the second terminal.

16. The method of claim 9, wherein the electronic devices comprise a system in package (SIP).

17. The method of claim 13, wherein the SMD component comprises a transformer.

18. An electronic device, comprising:
a package substrate;
at least one integrated circuit (IC) die comprising a substrate having a semiconductor surface including circuitry electrically coupled to bond pads positioned onto contact pads on a top surface of a package substrate,
at least one surface mount device (SMD) component including at least a first terminal and a second terminal on the package substrate positioned lateral to the IC die, and
at least one SMD interconnect including a tie bar electrically connecting to the first terminal and the second terminal to the bond pads,
a mold compound for encapsulating at least the IC die, wherein the tie bar extends to be exposed from an outer edge of the mold compound.

19. The electronic device of claim 18, wherein the SMD component comprises a capacitor or an inductor.

* * * * *